United States Patent [19]

Gulczynski

[11] Patent Number: 4,943,740
[45] Date of Patent: Jul. 24, 1990

[54] ULTRA FAST LOGIC

[76] Inventor: Zdzislaw Gulczynski, P.O. Box 441, Winchester, Mass. 01890

[21] Appl. No.: 180,431

[22] Filed: Apr. 12, 1988

[51] Int. Cl.$^5$ ................. H03K 19/096; H03K 19/088
[52] U.S. Cl. ...................... 307/454; 307/456; 307/272.2; 307/279; 365/174; 365/181
[58] Field of Search ........... 307/443, 454, 456, 272.1, 307/272.2, 279, 471, 255, 262; 365/174, 181

[56] References Cited

U.S. PATENT DOCUMENTS 4,808,845 2/1989 Suzuki et al. ...................... 307/570

FOREIGN PATENT DOCUMENTS 1069118 5/1967 United Kingdom ................ 307/272
2110030 6/1983 United Kingdom ................ 307/443

Primary Examiner—Stanley D. Miller
Assistant Examiner—M. Wambach

[57] ABSTRACT

The logic has an extremely high speed, very low number of components and large common mode rejection, and is intended to eliminate the emitter-coupled logic (ECL). The supply voltage and power consumption are small. The logic is particularly for digital systems requiring extremely fast and complex digital processing, such as supercomputers. One basic gate is responsive to and providing differential binary signals, and comprises a pair of transistors of opposite conductivity types, each having a base, emitter and collector, wherein the bases are separately coupled to gate inputs, the emitters are coupled together, and the collectors are separately coupled to gate outputs and further to a power supply via biasing resistors. Based on the basic gate is a memory cell which includes a positive feedback resistor and can be read and written via a single terminal.

21 Claims, 5 Drawing Sheets

ULTRA FAST LOGIC

CROSS REFERENCE TO RELATED INVENTIONS

This application is related to the applications entitled "Analog Power Amplifier", "High Efficiency Power Amplifier Comprising Multilevel Power Supply" and "High Speed Instrumentation Amplifier with Minimized Offset Voltage and Drift", all filed on even date herewith, "Power Amplifier" Serial No. 027,561 filed on 03/18/87 and "Operational Amplifier" Serial No. 027,560 filed on 03/18/87, "Operational Amplifier" Serial No. 843,165 filed on 03/24/86, now US Patent No. 4,714,894 issued on 12/22/87, and "Push-Pull Power Amplifier" Serial No. 330,202 filed on 12/14/81, now US Patent No. 4,476,441 issued on 10/09/84. All inventions are by the same inventor.

BACKGROUND OF THE INVENTION

The invention relates to an ultra fast logic circuitry, particularly for digital systems requiring extremely fast and complex digital processing, such as supercomputers.

Logic circuits consist of gates coupled to perform complex logic operations, wherein certain circuit combinations are distinguished. For instance, counters are employed to count input pulses, RAMs are used for an interim storage. An actual internal structure of a digital circuit may be simpler than of one built with gates, e.g. due to internal couplings of individual gate terminals.

Conventional logic devices receive and process a plurality of single binary signals. This results in the deficiency of substantial gate delays even with relatively short connection length. For instance, on-chip connections of current mode logic (CML) are very critical and must be taken into account. The single binary signals derive from output stages of foregoing gates providing bidirectional output currents. Similarly, the output stages are driven by single binary signals. Some logic devices have a pair of output terminals providing complementary signals which, however, are used as single binary signals. Line drivers are special components employed for converting the single binary signals into differential signals and are intended to drive twisted pair lines. A reverse operation is performed by line receivers. The differential signals are binary signals which appear across a pair of terminals, none of which is grounded.

The output stage may consist of an output transistor having a base controlled by a single binary signal, and one of the remaining electrodes coupled via a resistor to a power supply rail. Such a pull-up or pull-down resistor requires a small value in order to compensate for unequal output rise and fall times. This results in an excessive supply current dependent on the logic state of each gate. The output transistor must be capable of conducting relatively high currents consisting of the resistor and load currents.

Push-pull output stages have an increased number of switching components, wherein mostly three transistors are employed. This results in significantly reduced switching times. Push-pull output stages are typical of transistor-transistor logic (TTL). A most common logic family is based thereon.

Emitter coupled logic (ECL) has fastest switching rates and shortest propagation delays of any silicon technology. However, power consumption is very high and some ECL systems require liquid cooling. ECL circuits require a specific negative supply voltage and another voltage for a terminating resistor return. CML is obtained by eliminating the ECL output stage consisting of a transistor and a pull-down resistor. CML has higher speed and lower power consumption. However, a CML loaded gate may have significantly lower switching times due to reduced fan-out and interconnection driving capability. Troublesome ground-loop errors are normally associated with single-wire transmission.

The conventional logic devices are responsive to absolute values of single binary signals and demand a uniform supply voltage. Very critical are supply voltage ripples which may cause erroneous operation of the logic components. Moreover, the switching thereof may cause very large supply current changes, as in case of complementary MOS (CMOS) logic. The output current of a single ECL output stage is large and depends on the logic state thereof. This is often compensated by providing complementary outputs which however further increases the power consumption.

SUMMARY OF THE INVENTION

The invention is intended to provide a logic having an extremely high speed, very low number of components and large common mode rejection. Moreover, the power consumption is relatively small and independent of logic states of the gates. The logic inherently provides a differential output signal with the output terminals protected against a short circuit to the supply voltage and ground. The supply voltage can be small. For the above reasons, the invention is intended to eliminate the troublesome ECL and take over new technologies thru employment of respective switching components, such as GaAs MESFETs.

According to the invention a logic responsive to and providing differential signals solves these problems. Specifically, a logic apparatus according to the present invention comprises a pair of inputs and a pair of outputs, a pair of transistors of opposite conductivity types, each having a base, emitter and collector, wherein the bases are separately coupled to the inputs, the emitters are coupled together and the collectors are separately coupled to the outputs, and a pair of means for biasing the transistors, separately coupled to the collectors thereof. In another embodiment a bistable logic apparatus comprises a pair of inputs and an output, a pair of transistors of opposite conductivity types, each having a base, emitter and collector, wherein the bases are separately coupled to the inputs, the emitters are coupled together and the collector of one transistor is coupled to the output, a pair of means for biasing the transistors separately coupled to the collectors thereof, and a resistive means for coupling the collector of the one transistor to the base of the other transistor.

BRIEF DESCRIPTION OF THE DRAWINGS

The present invention will become more clear in conjunction with the accompanying figures of which.

Throughout the drawings, similar references denote similar parts.

DETAILED DESCRIPTION OF THE INVENTION

Figure 1:
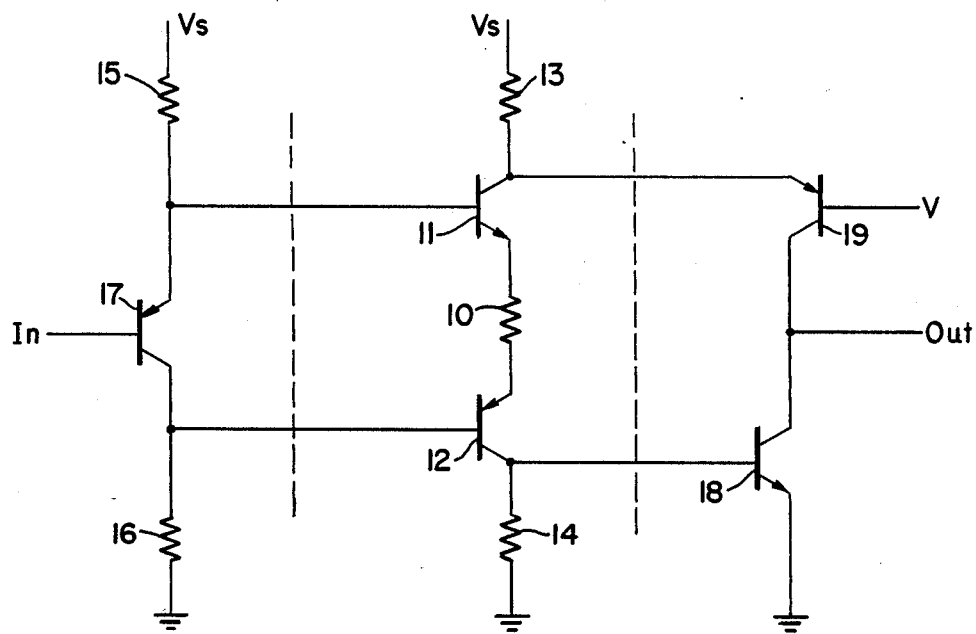
FIG. 1 shows a basic gate structure of the present invention and a pair of interface buffers.

FIG. 1 shows a basic gate structure of the present invention. The gate consists of the transistors 11 and 12 of opposite conductivity types and the resistors 10, 13 and 14. Specifically, the transistors 11 (npn) and 12 (pnp) are coupled together via means for coupling the emitters thereof, which means is the resistor 10 in the FIG. 1 embodiment. The bases of the transistors 11 and 12 constitute a pair of gate inputs for receiving the differential input signal. Similarly, their collectors are coupled to a pair of gate outputs for providing the differential output signal, and are further separately coupled to a pair of biasing means. Specifically, the collectors of 11 and 12 are coupled via the resistors 13 and 14 to the voltage source Vs and ground respectively. For simplicity, Vs labels the voltage source and the voltage provided thereby.

An input means for converting a single binary signal into the differential signal is also shown in FIG. 1. The circuit consists of the pnp transistor 17 having base for receiving the single binary signal, and the resistors 15 and 16 coupling the emitter and collector of the transistor 17 to Vs and ground respectively. The differential signal appears between the emitter and collector of the transistor 17, further coupled to the bases of the transistors 11 and 12 respectively. The input means can be employed for interfacing the logic of the present invention with other logic types, e.g. TTL.

An output means for converting the differential signal into a single binary signal is also shown in FIG. 1. The circuit consists of the transistors 19 (pnp) and 18 (npn) having emitter and base coupled to the collectors of the transistors 11 and 12 respectively for receiving the differential signal. The collectors of the transistors 19 and 18 are tied together for providing the single binary signal. The base of the transistor 19 is coupled to a fixed voltage V which can be obtained by means of a resistor pair dividing the supply voltage Vs. The emitter of the transistor 18 is coupled to ground. The output means can be employed for interfacing the logic of the present invention with other logic types, e.g. TTL.

When the input binary signal is high, e.g. equal Vs, the transistor 17 is off. The transistors 11 and 12 are saturated as the base currents thereof are flowing thru the resistors 15 and 16 respectively. The signal appearing across the inputs of the gate is equal to a sum of the base-emitter voltages of the transistors 11 and 12, and the voltage drop across the resistor 10. Thus, the resistor 10 is employed for increasing the gate input voltage. By these means, a plurality of inputs of different gates can be coupled together, each employing a pair of transistors with essentially different base-emitter characteristics. However, the resistor 10 is superfluous when the gates are fabricated on a single chip.

The basic gate of the present invention is thus an inverter having a pair of inputs provided by bases of the transistors, and a pair of outputs having open collector properties. The input impedance of the gate is very high when the transistors are cut off. The basic gate shown in FIG. 1 is further coupled to a pair of interface buffers. The single binary input signal is inverted by means of the basic gate and appears as the single binary output signal.

Figure 2:
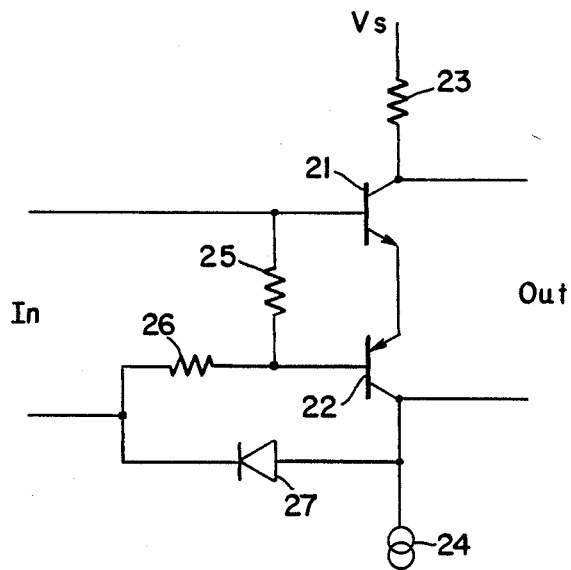
FIG. 2 is another embodiment of the basic gate.

FIG. 2 shows another embodiment of the basic gate which includes the components 21 thru 23 corresponding to respectively 11 thru 13 of FIG. 1. The employment of the current source 24 coupled to the collector of the pnp transistor 22 has a number of advantages. For example, increased is the stability of transistor switching characteristics and of the supply current with varying supply voltage Vs. A higher supply voltage can be used while the value of the resistor 23 is small. The voltage drop thereacross can be predetermined as to avoid the saturation of the transistor 21. The resistor 23 and current source 24 are employed for biasing the transistors 21 and 22 respectively, and are coupled to the collectors thereof. The resistor 23 can be replaced by for a current source.

Generally, the differential input signal is applied to the bases of the transistors via an input means as in FIG. 1. The input means of FIG. 2 includes the resistor 25 which affects both transistors 21 and 22 as it couples the bases thereof. The resistor 25 can be used e.g. for obtaining a specific input impedance of the gate. Furthermore, the resistor 26 is coupled in series with the base of the transistor 22 for increasing the maximum voltage appearing across the gate inputs. The employment of the base resistor 26 has an advantage over an emitter resistor, such as 10 of FIG. 1, as the maximum gate input voltage is now increased without increasing the minimum gate output voltage. Another resistor can be coupled in series with the base of the transistor 21.

The basic gate also comprises the diode 27 coupled as to shunt excess base current drive from the base to collector of the transistor 22. This prevents a build-up of stored charge in the base thereof and eliminates the most significant delay, i.e. storage time of a transistor driven into saturation. The ordinary diode 27 is coupled to the collector and base of the transistor 22 directly and via the resistor 26 respectively. Analogously, a Schottky diode can be coupled directly to the collector and base of the transistor 22. An integration of these two components results in a Schottky clamped transistor.

Figure 3:
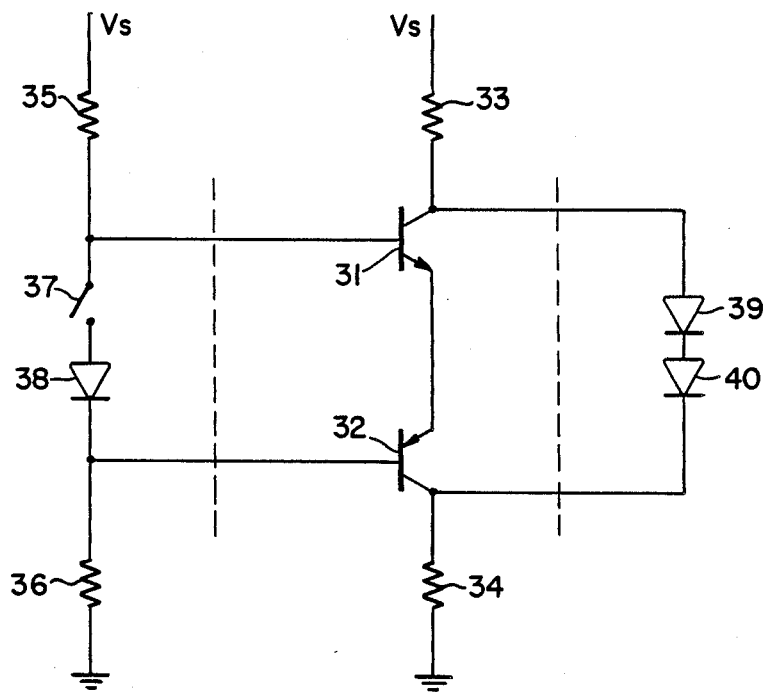
FIG. 3 shows the preferred embodiment of the basic gate and suitable equivalent circuits of similar gates coupled thereto.

FIG. 3 shows the preferred embodiment of the basic gate. The gate consists of the transistors 31 and 32, each Schottky clamped as shown, and the resistors 33 and 34. These components correspond to respectively 11 thru 14 of FIG. 1, whereas the emitters of the transistors 31 and 32 are tied together. The inputs and outputs of the gate are coupled to respectively outputs and inputs of similar gates whose suitable equivalent circuits are also shown. An equivalent output circuit of one gate or a plurality of gates coupled in parallel comprises the components 35 thru 38. The switch 37 and the diode 38 are coupled in series and are further coupled to the source Vs and ground via the resistors 35 and 36 respectively. The diodes 39 and 40 coupled in series is an equivalent input circuit of the other gate or a plurality of gates with inputs coupled in parallel.

High and low signals are defined as differential signals which turn the transistors of the basic gate on and off respectively while applied to the inputs thereof, i.e. between bases of the respective transistors. The high signal results in a voltage across the bases equal Vb+Vb, referred to as 2Vb. Obviously, the high and low signals applied across the gate inputs result in respectively low and high signals appearing across the gate outputs, i.e. between collectors of the respective transistors. The low signal can be accomplished by means of short circuit or a source providing a voltage below 2Vb and having an internal resistance possibly equal zero. In contrast, the high signal can be accomplished by means of a source providing a voltage above 2Vb and having an internal resistance greater than zero. In particular, the high signal is provided by a source consisting of the supply voltage source Vs and having the internal resistance equal to the sum of values of the biasing resistors. These resistors are coupled to the outputs of the gate for limiting the output current thereof. A low signal is applied to the FIG. 3 gate when the switch 37 is closed. The transistors 31 and 32 are off, whereby the voltages between the bases and collectors thereof are equal to the voltage drops across the diode 38, and the diodes 39 and 40 respectively. The voltage of the conducting diode 38 is referred to as Vd. Similarly, a high signal is applied to the gate when the switch 37 is open. The transistors 31 and 32 are on, whereby the voltage between the bases thereof is substantially equal 2Vb, i.e. the voltage drop across two diodes such as 39 and 40. The voltage between the collectors is substantially equal Vd, i.e. the voltage drop across one diode such as 38. Vd is determined by the Schottky clamp diodes of the transistors 31 and 32, further preventing a saturation thereof.

The supply current is independent of logic states of the gates. Assuming equal switching characteristics of the transistors 31 and 32, and the values of the resistors 33 thru 36 equal R, the following equation applies to the supply current I:

$$R\ I = Vs - 2\ Vb + Vd$$

Obviously, the supply current is proportional to the number of resistors employed in the circuit, whereas a plurality of gates can share one pair of the biasing resistors as shown hereafter.

Figure 4:
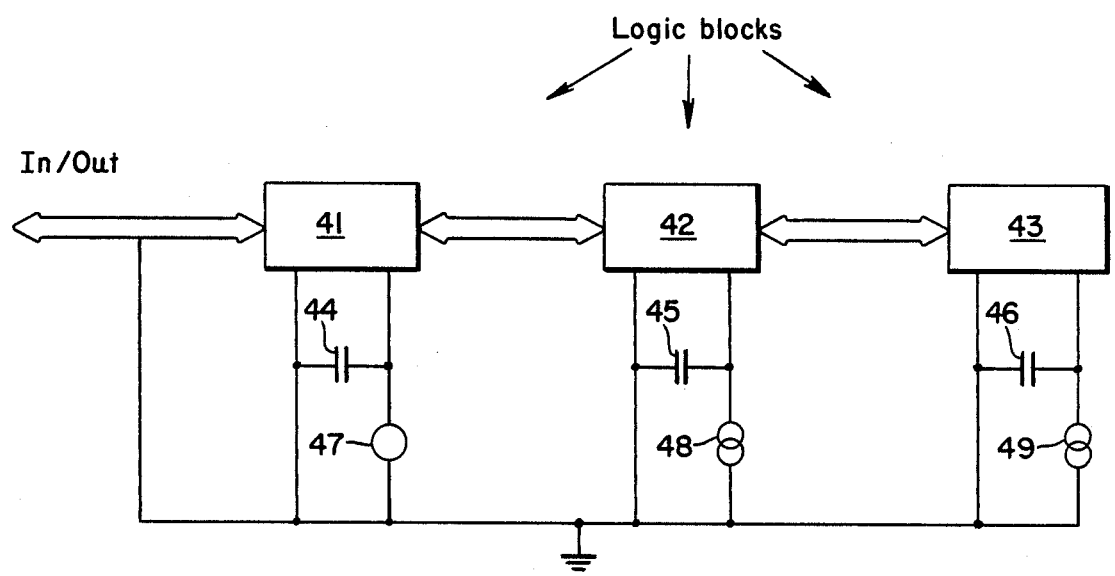
FIG. 4 is an embodiment of a digital system with a power supply network.

The supply current depends on temperature as defined by thermal characteristics of the individual transistors, if Vs is fixed. The supply current variations are reduced as the changes of Vb are partially compensated by Vd, both having negative temperature coefficients. The supply current determines emitter currents of the individual transistors. Therefore, its fixed value is desirable so that the transistors can be optimized for high current gain, matched characteristics, fast switching times, etc. A fixed supply current can be obtained by means of a power supply sensing temperature of the integrated circuit and providing a corresponding voltage in response thereto. A semiconductor temperature sensor may be also integrated. FIG. 4 is an embodiment of a digital system including the logic of the present invention with a power supply network. The system consists of three logic blocks having separate power supplies. Specifically, the block 41 comprises an input/output circuitry for supporting the In/Out bus which may be TTL compatible. The block 41 may contain interface buffers, such as shown in FIG. 1, and common peripheral components such as transceivers, buffers/line drivers, etc. The blocks 42 and 43 comprise the logic of the present invention. The separate power supplies improve the operating conditions of the individual blocks and reduce the total power consumption. For instance, the blocks 42 and 43 may include a microprocessor based system and an associated large capacity RAM respectively, and consume substantially different amounts of power.

The power supply of the block 41 comprises the source 47 providing a constant voltage necessary for ordinary logic families. The power supplies of the blocks 42 and 43 comprise the current sources 48 and 49 respectively. Currents provided thereby may be fixed or dependent on the temperature of the respective blocks. The capacitors 44 thru 46 are coupled in parallel with the sources 47 thru 49 respectively in order to reduce supply voltage ripples.

All elements 41 thru 49 are coupled to a ground rail providing the reference. The In/Out bus includes at least one line coupled to the rail. Each bus coupled to the block 42 comprises line pairs which carry differential signals. This eliminates troublesome ground-loop errors normally associated with single-wire transmission. The conventional logic devices are responsive to absolute values of single binary signals and demand a uniform supply voltage. In contrast, a fixed supply voltage for the logic of the present invention is unnecessary, thus different supply voltages of the blocks 41 thru 43 are allowable.

Figure 5:
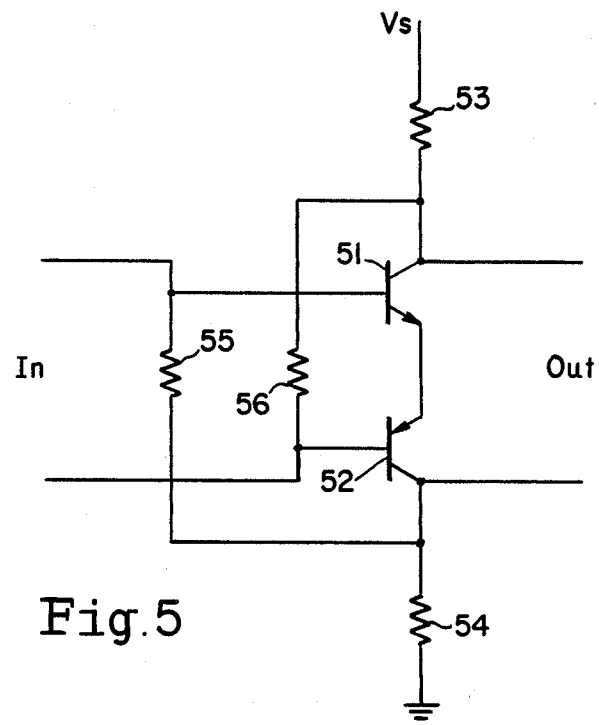
FIG. 5 is an embodiment of a flip-flop.

FIG. 5 is an embodiment of a flip-flop. It consists of the components 51 thru 54 corresponding to respectively 31 thru 34 of FIG. 3, and a pair of resistors 55 and 56 introducing a positive feedback. Therefore, the flip-flop is the basic gate of FIG. 3, further having the pair of resistors each coupled between base and collector of both transistors.

The flip-flop is set by applying the low signal across the inputs thereof. The transistors 51 and 52 are turned off. Applying now a high signal to the inputs of the flip-flop does not change the logic state thereof. The transistors 51 and 52 remain off as the bases thereof are pulled in adequate directions by the resistors 55 and 56 respectively. The output signal of the flip-flop is high.

Similarly, the flip-flop is reset by simultaneously applying high and low signals to the inputs and outputs thereof respectively. The transistors 51 and 52 remain on after removing the low signal from the outputs of the flip-flop. This is not affected by the positive feedback thru the resistors 55 and 56 due to adequate values thereof. The output signal of the flip-flop is low.

As pointed out, the high signal may be provided by a source consisting of the supply voltage source Vs and having the internal resistance equal to the sum of values of the biasing resistors. Due to this internal resistance the logic state of the set flip-flop remains unchanged while applying the high signal to the inputs thereof. The low signal can be applied to the flip-flop outputs since a plurality of gates can share one pair of the biasing resistors as shown hereafter.

Figure 6:
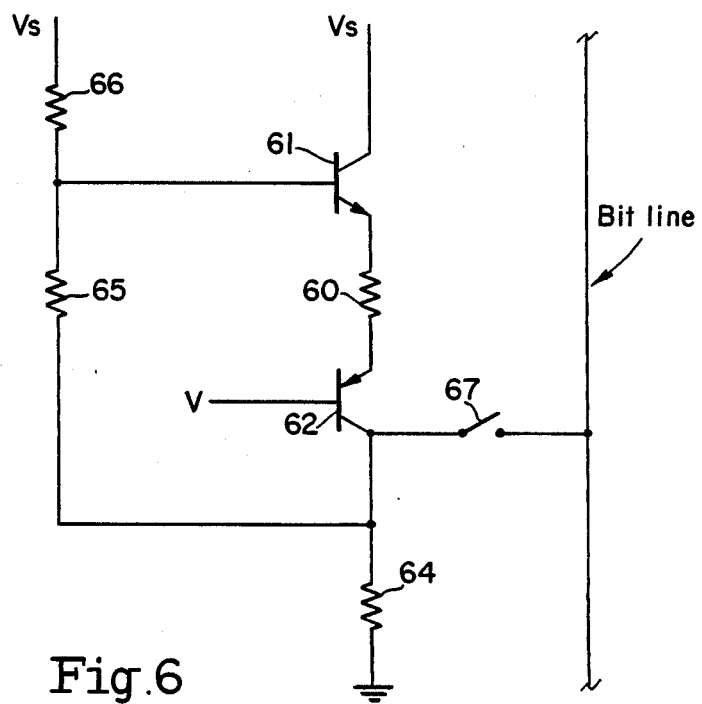
FIG. 6 is the preferred embodiment of a memory cell.

FIG. 6 is the preferred embodiment of a memory cell. The circuit includes the npn transistor 61, Schottky clamped pnp transistors 62 and resistors 60, 64, and 66. These components correspond to respectively 11, 12, 10, 14 and 15 of FIG. 1. The resistor 65 introduces a positive feedback and is coupled between the base and collector of the transistors 61 and 62 respectively, similarly to the resistor 55 of FIG. 5. The collector and base of the transistors 61 and 62 are coupled to the voltages Vs and V respectively. The collector of the transistor 62 is coupled to the Bit Line via the switch 67. It is assumed initially that the switch 67 is closed. The cell is set if the Bit Line is coupled a voltage source providing a voltage above a threshold. The transistors 61 and 62 are turned on and remain so when the source is disconnected. The cell acts now as a source and provides to the Bit Line a voltage higher than V. Similarly, the cell is reset if the Bit Line is coupled to a voltage source providing a voltage below a threshold. The transistors 61 and 62 are turned off and remain so when the source is disconnected. The cell acts now as a source and provides to the Bit Line a voltage higher than zero.

Therefore, the memory cell is selected by closing the switch 67. The Bit Line is common to all such memory cells via respective switches. A bit is written to the cell when a voltage below or above a threshold is applied to the Bit Line. Similarly, a bit is read from the cell by sampling the voltage appearing on the Bit Line.

The voltage V is used to increase output voltage swing of the cell and can be common to a plurality of cells. Furthermore, V can depend on temperature in order to compensate for thermal changes of the base-emitter voltages of the transistors 61 and 62. The resistor 60 improves the thermal stability and also limits the current flowing thru the switch 67 when the set cell is being reset. Obviously, the transistors 61 and/or 62 can be replaced by FETs, whereby the resistor 60 is superfluous. Generally, the cell has a pair of inputs separately coupled to the bases of the transistors 61 and 62, whereby the logic state of the cell can be determined by input potentials. In the FIG. 6 embodiment, the inputs are separately coupled to sources providing predetermined signals. Specifically, one source comprises the resistor 66 coupled in series with the supply voltage source Vs for providing a current to the base of the transistor 61. The other source provides the voltage V to the base of the transistor 62. For instance, the cell can be set or reset by adequately altering the voltage V. As mentioned, V can be applied to a plurality of cells.

Similarly to FIG. 5 embodiment, a second output of the cell can be obtained by coupling the collector of the transistor 61 to the source Vs via a resistor. A differential output signal appears between the two outputs. Furthermore, the positive feedback can be increased if the source coupled to the base of the transistor 62 exhibits an internal resistance and a resistor coupling the collector and base of the transistors 61 and 62 respectively is employed, similarly to 56 of FIG. 5.

Figure 7:
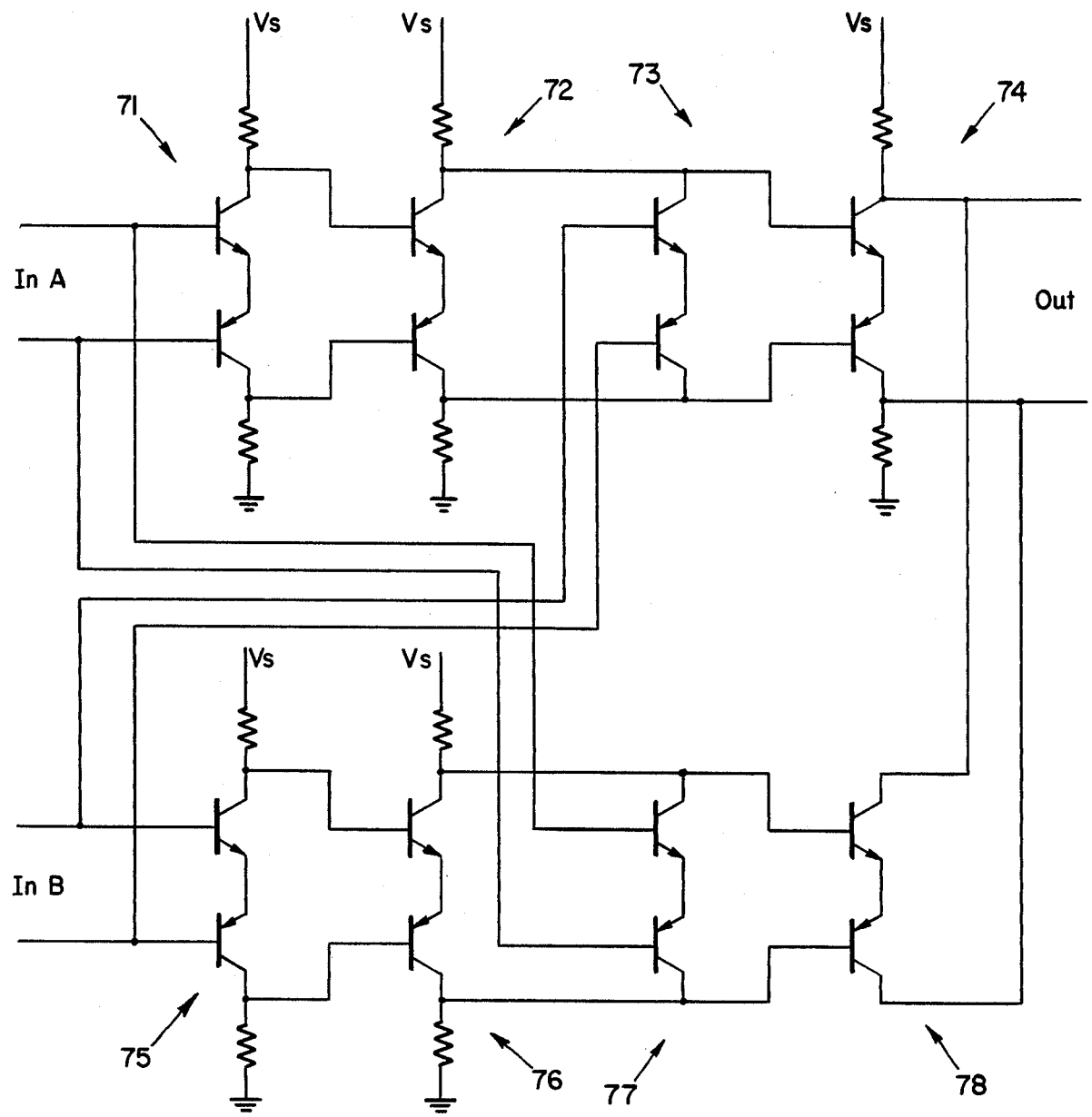
FIG. 7 is an embodiment of an XNOR gate.

FIG. 7 is an embodiment of an XNOR gate which also illustrates two techniques of coupling the basic gates of the present invention. Specifically, the gate inputs can be coupled together. Similarly, the gate outputs can be coupled together, whereby only one pair of biasing resistors is necessary. The circuit consists of two like chains each having two pairs of inputs with two differential signals separately applied thereto. The signals are XNORed. The pairs of outputs of the chains are tied together, whereby the result appears thereat.

Specifically, the first and second chains consist of the gates 1 thru 74 and 75 thru 78 respectively. The inputs of the gates 1, 77 and 75, 73 are coupled to InA and InB respectively. Two pairs of resistors are eliminated as the outputs of the gates 2, 73 and 76, 77 are tied together respectively. Another pair of resistor is eliminated by coupling the outputs of the gates 4, 78. The gate inputs are tied together by coupling the bases of like transistors. Analogously, the gate outputs are tied together by coupling the collectors of like transistors. The same amount of components is required to accomplish the XOR function.

Figure 8:
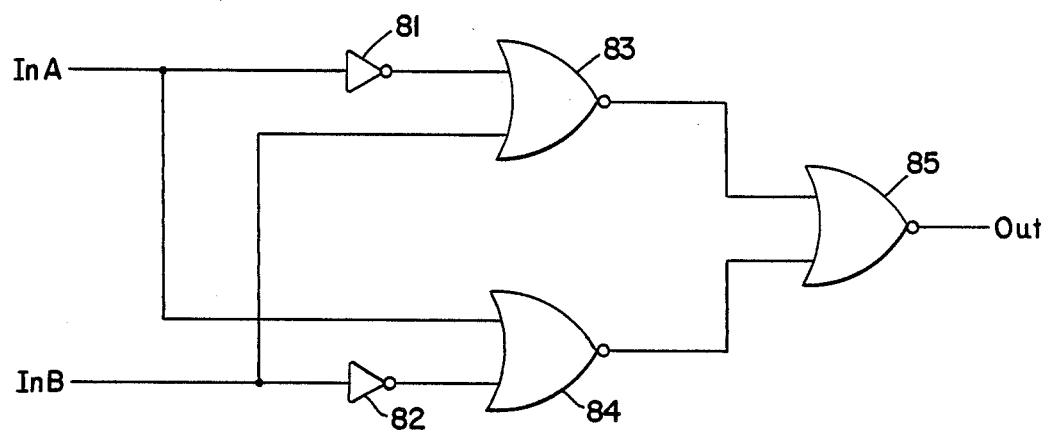
FIG. 8 is an equivalent schematic of the XNOR gate with conventional gates.

FIG. 8 is an equivalent schematic of the XNOR gate with conventional gates. Such a transformation facilitates designing of complex logic structures. The inputs InA and InB are coupled to the inputs of the inverters 81 and 82 respectively. The output signals thereof are NORed with the signals applied to InB and InA, by the NOR gates 83 and 84 respectively. The outputs thereof are coupled to the inputs of the NOR gate 85, further providing the output signal of the XNOR gate. The inverters 81 and 82 correspond to the basic gates 71 and 75 of FIG. 7 respectively. The 2-input NOR gates correspond to a pair of basic gates with outputs tied together and having a common pair of biasing resistors. For instance, the gate 83 corresponds to the gates 72 and 73 of FIG. 7. Obviously, an n-input NOR gate can be obtained by coupling outputs of n gates, wherein only one pair of biasing resistors is necessary.

Figure 9:
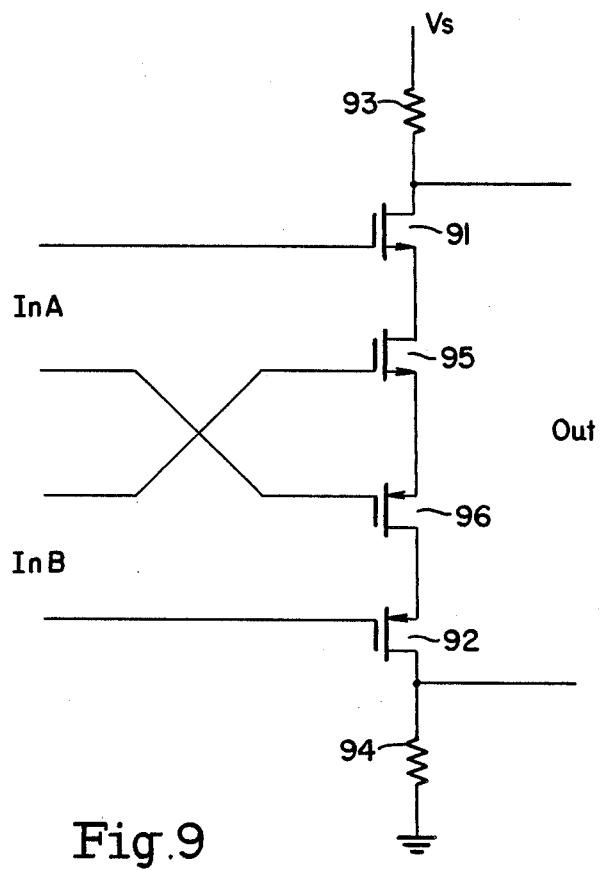
FIG. 9 is an embodiment of a NAND gate.

FIG. 9 is an embodiment of a NAND gate. Gate, source and drain of any MOSFET correspond to base, emitter and collector of a bipolar transistor respectively. The NAND The gate includes the components 91 thru 94 coupled similarly to 11 thru 14 of FIG. 1. However, the means for coupling the sources of the MOSFETs 91 and 92 consists of the MOSFET pair 95 (n-channel) and 96 (p-channel) having sources tied together. The drains thereof are coupled to the sources of the even polarity MOSFETs 91 and 92 respectively. MOSFETs 91, 92, 95 and 96 are employed since the drain-source on-voltages thereof are smaller than corresponding collector-emitter voltages of saturated bipolar transistors. These on-voltages are also significantly smaller than minimum collector-emitter voltages of Schottky clamped bipolar transistors.

The signals applied to the inputs InA and InB are NANDed. These signals can be applied to the gates of the transistors 91, 92 and 95, 96 respectively. However, FIG. 9 shows inputs InA and InB provided by the gates of the transistors 91, 96 and 92, 95 respectively. The advantage of this arrangement is that the drain-source voltages of the respective transistors equally affect both input switching characteristics of the NAND gate. Obviously, an n-input NAND gate can be obtained by cascading n transistor pairs in similar fashion, wherein only one pair of the biasing resistors is necessary.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Logic apparatus providing differential binary output signal in response to differential binary input signal, comprising:
 a pair of input terminals with the differential binary input signal applied thereacross;
 a pair of output terminals with the differential binary output signal appearing thereacross;
 a pair of transistors of opposite conductivity types, each having a base, emitter and collector electrodes,
 wherein the base electrodes are separately coupled to the inputs, one emitter electrode provides a signal to the other emitter electrode in the absence of an input or output taken therefrom and the collector electrodes are separately coupled to the outputs; and a pair of means for biasing the transistors, separately coupled to the collector electrodes thereof.

2. Apparatus of claim 1 further including one or two diode means each coupled between the base and collector electrodes of one of the transistors for preventing a saturation thereof.

3. Apparatus of claim 1 wherein at least one means for biasing includes a voltage source and a resistor coupled in series therewith.

4. Apparatus of claim 1 wherein at least one means for biasing includes a current source.

5. Apparatus of claim 1 further including an input means for applying the differential binary input signal to the base electrodes of the transistors.

6. Apparatus of claim 5 wherein the input means includes a resistor coupled between the base electrodes of the transistors.

7. Apparatus of claim 5 wherein the input means includes a resistor coupled in series with one input.

8. Apparatus of claim 5 further including one or two diode means each coupled between one of the inputs and the collector electrode of one of the transistors for preventing a saturation thereof.

9. Apparatus of claim 1 further including an input means having a third input terminal for providing the differential binary input signal in response to a single binary signal applied to the second input.

10. Apparatus of claim I further including an output means having a third output terminal, for providing a single binary signal thereat in response to the differential binary output signal.

11. Apparatus of claim 1 further including means for applying the signal of the one emitter electrode to the other emitter electrode.

12. Apparatus of claim 11 wherein the means for applying includes a resistor.

13. Apparatus of claim 11 wherein the means for applying includes:
a pair of second inputs; and
a pair of second transistors of opposite conductivity types, each having a base electrode separately coupled to one of the second inputs, an emitter electrode providing a second signal to the emitter electrode of the other second transistor, and a collector electrode coupled to the emitter electrode of the first said transistor of even conductivity type.

14. Bistable logic apparatus, comprising:
a pair of inputs and an output;
a pair of transistors of opposite conductivity types, each having a base, emitter and collector electrodes,
wherein the base electrodes are separately coupled to the inputs, one emitter electrode provides a signal to the other emitter electrode in the absence of an input or output signal taken therefrom and the collector electrode of one transistor is coupled to the output;
a pair of means for biasing the transistors separately coupled to the collector electrodes thereof; and
a resistive means for applying a signal appearing at the collector electrode of the one transistor to the base electrode of the other transistor.

15. Apparatus of claim 14 wherein at least one of the transistors is of Schottky type.

16. Apparatus of claim 14 wherein at least one means for biasing includes a voltage source and a resistor coupled in series therewith.

17. Apparatus of claim 14 including one or two source means for providing predetermined signals, wherein the source means are separately coupled to the inputs.

18. Apparatus of claim 14 further including a second output coupled to the collector electrode of the other transistor, wherein a differential binary output signal appears between the first said and second outputs.

19. Apparatus of claim 14 further including a second resistive means for applying a signal appearing at the collector electrode of the other transistor to the base electrode of the one transistor.

20. Apparatus of claim 14 further including a resistive means for applying the signal of the one emitter electrode to the other emitter electrode.

21. Apparatus of claim 14 further including a switch coupled in series with the output.

* * * * *

UNITED STATES PATENT AND TRADEMARK OFFICE
CERTIFICATE OF CORRECTION

PATENT NO. : 4,943,740

DATED : July 24, 1990

INVENTOR(S) : Zdzislaw Gulczynski

It is certified that error appears in the above-identified patent and that said Letters Patent is hereby corrected as shown below:

```
Col. 4, line 22, delete "for"

Claim 1,
Column 8, line 56;
line 4, delete "terminals"
Column 8, line 58;
line 6, delete "terminals"

Claim 9,
Column 9, line 25;
line 2, delete "terminal"
Column 9, line 27,
line 4, change "second" to --third--
Column 10, line 25;
Claim 17, line 1, after "14" insert --further--
```

Signed and Sealed this

Twenty-third Day of June, 1992

Attest:

DOUGLAS B. COMER

Attesting Officer

Acting Commissioner of Patents and Trademarks